US010129994B1

(12) United States Patent
Sulem et al.

(10) Patent No.: US 10,129,994 B1
(45) Date of Patent: Nov. 13, 2018

(54) WATER-TIGHT ELECTRONIC DEVICE DISPLAY

(71) Applicant: Amazon Technologies, Inc., Seattle, WA (US)

(72) Inventors: Firmansyah Sulem, San Jose, CA (US); Robert L. D. Zenner, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/811,422

(22) Filed: Nov. 13, 2017

Related U.S. Application Data

(60) Provisional application No. 62/570,611, filed on Oct. 10, 2017.

(51) Int. Cl.
*H05K 5/06* (2006.01)
*H05K 1/18* (2006.01)
*H05K 5/00* (2006.01)

(52) U.S. Cl.
CPC ............. *H05K 5/065* (2013.01); *H05K 1/189* (2013.01); *H05K 5/0017* (2013.01); *H05K 5/0034* (2013.01)

(58) Field of Classification Search
CPC ...... H05K 5/065; H05K 1/189; H05K 5/0017; H05K 5/0034; G02B 6/0081
See application file for complete search history.

(56) References Cited

U.S. PATENT DOCUMENTS

| 9,383,768 B1* | 7/2016 | Menon ................. G06F 1/1656 |
| 9,664,835 B2* | 5/2017 | Kleo .................... F21V 33/0012 |
| 2014/0369063 A1* | 12/2014 | Kleo .................... F21V 33/0012 |
| | | 362/551 |

\* cited by examiner

*Primary Examiner* — James Wu
(74) *Attorney, Agent, or Firm* — Lee & Hayes, PLLC

(57) ABSTRACT

An electronic device includes a housing and a water tight display disposed within the housing. The display may include a light guide and a gasket coupled to at least a portion of the light guide. A cavity may be interposed between the gasket and the light guide. A flexible printed circuit assembly (FPCA) may couple to the light guide and the gasket to seal an opening of the cavity. Light sources may be connected to the flexible printed circuit assembly and disposed within the cavity. Adhesive tape may couple to the light guide and the gasket on a side opposite the FPCA to seal an opening of the cavity. Collectively, the light guide, the gasket, the flexible printed circuit assembly, and the adhesive tape may prevent water from reaching the cavity.

20 Claims, 6 Drawing Sheets

WATER-TIGHT ELECTRONIC DEVICE DISPLAY

CROSS REFERENCE TO RELATED APPLICATIONS

This application claims priority to U.S. Provisional Application No. 62/570,611, filed Oct. 10, 2017, which is incorporated herein by reference.

BACKGROUND

Electronic devices come in many different shapes and sizes, and housings for such devices are made of a wide variety of materials. Most electronic devices have housings made of hard plastic or metal, which provide at least some structural support and protection for internal components. However, such housings often fail to protect the internal components from liquids that penetrate the electronic device and damage or affect components therein. For instance, displays, light sources, or electronic components may be short-circuited or water may distort an appearance of emitted light.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Figure 1:
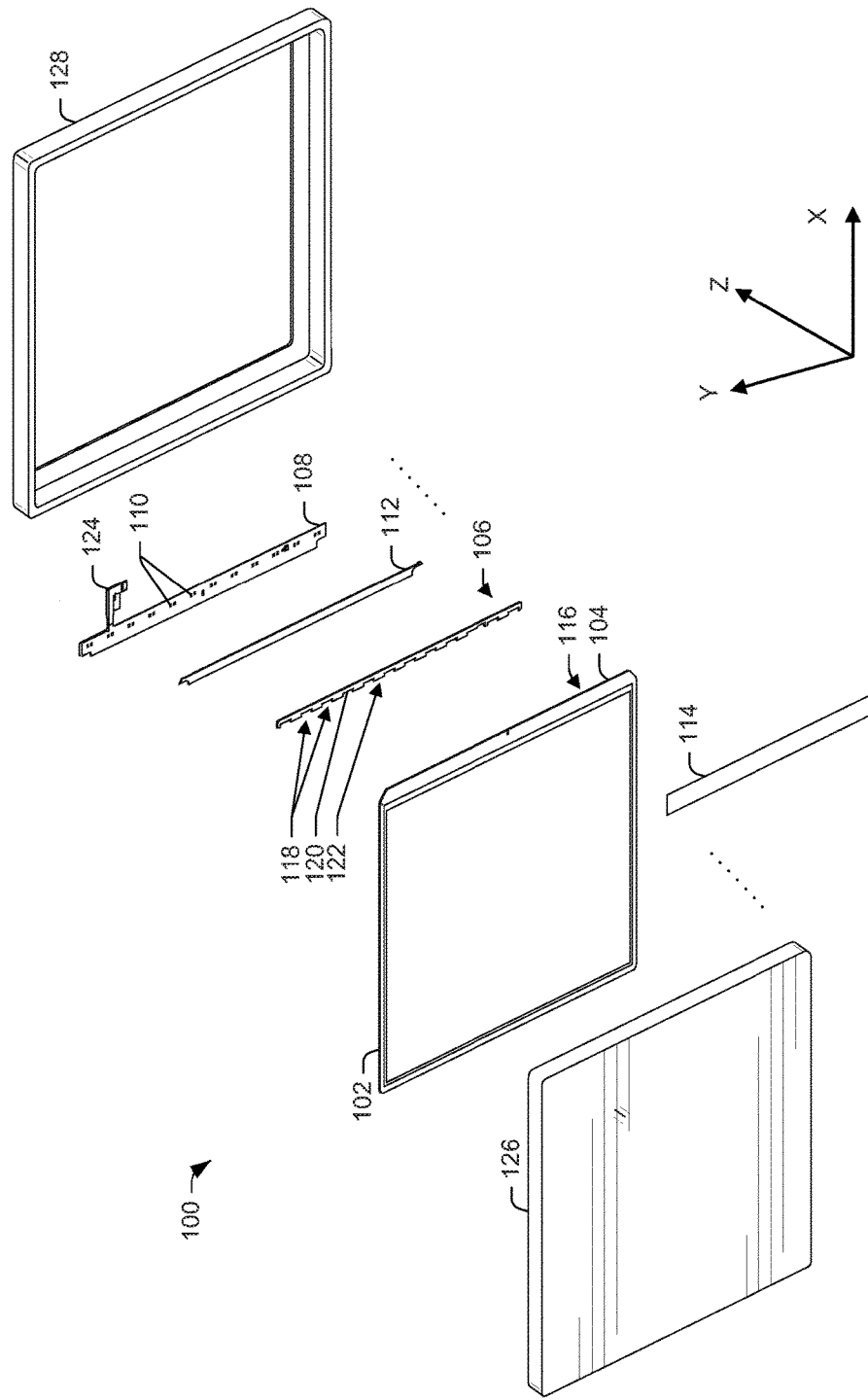
FIG. 1 is an exploded perspective view of an electronic device including an example display.

As discussed above, electronic devices may be susceptible to water damage or may otherwise be adversely impacted by water that enters and/or contacts internal components of the electronic device. Existing approaches to prevent water from damaging an electronic device have focused on preventing water from entering an outer enclosure of the electronic device using seals or sealants. These existing approaches have been unsatisfactory and insufficient to adequately waterproof electronic devices. For instance, seals or sealants may increase a weight or bulkiness of the electronic device, may decrease a performance of the electronic device, or may not effectively resist water. Accordingly, electronic devices may be susceptible to failure when water contacts internal components. For instance, in the event that water enters the outer enclosure of such existing electronic devices, the water may permeate around one or more light sources and may discolor or otherwise degrade an appearance of a display of the electronic device, or may short circuit or otherwise damage or degrade the internal components.

This application describes a water tight enclosure that may be included in electronic devices and/or displays. The water-tight enclosure may prevent water from entering, damaging, and/or adversely affecting internal components located within the electronic device. In some instances, a display according to this application may include a light guide, one or more light sources, a gasket, a circuit board, and adhesive tape. In combination, the components of the display may provide a water-tight enclosure that protects and prevents water from entering cavities housing the light source(s) or other electronic components. In some instances, the display may reside within a housing of an electronic device, such that the display is enclosed on at least five sides by the housing of the electronic device. The housing of the electronic device may provide some water resistance. For example, in some instances, the housing may wrap around at least a periphery of a sixth (front) side of the display and may seal to the sixth side of the display to resist water entering the housing.

In the event that water does enter the housing, the water-tight enclosure of the display may prevent water from permeating or damaging certain components located within the electronic device housing (e.g., a display or light sources). The water-tight enclosure may prevent water from entering the cavities and becoming interposed between the light sources and the light guide, for instance, eliminating a distortion of light emitted by the light sources (e.g., blue shift). The components of the display may also be sufficiently bonded or coupled to one another so as to resist peeling away, delaminating, or otherwise separating.

The display may generally include a display area and one or more components that provide power, light, and/or functionality to the display screen. The display area may include a liquid crystal display (LCD), a light emitting diode display (LEDD), a plasma display, an electronic ink (e-ink) display, a flexible display, a combination of any of the foregoing, or other display technologies. In some instances, the display area may be touch sensitive and capable of receiving input by touching the display area with a finger, hand, thumb, stylus, or other pointing device.

The light guide may include an optical element designed and configured to redirect light from the light sources towards the display area. To accomplish this, the light guide may comprise any type of light diffuser that transmits light from the light sources and out one or more projecting side(s) of the display area. In some instances, the light guide may comprise a milky or translucent material, such as polycarbonate, that causes the light to disperse at various angles, resulting in a substantially uniform dispersion of light.

The gasket may be adhered or otherwise coupled to at least a portion of the light guide. The gasket may include an interior surface facing or disposed adjacent to the light guide and an exterior surface opposite the interior surface and distal from the light guide. In some instances, the gasket and the light guide may be coupled together at one or more locations (e.g., first and second ends of the gasket may be coupled to the light guide), forming a water-tight seal. For instance, at least a portion of the interior surface of the gasket may be adhered to at least a portion of an exterior surface of the light guide. In some examples, the first and second ends of the gasket may be bonded or coupled to the first and second ends of the exterior surface of the light guide, with a space between a middle portion of the gasket and a middle portion of the light guide defining one or more cavities.

The light guide and the gasket may be of a similar thickness and/or may occupy a same layer of the display. In some instances, the light guide and the gasket may have substantially planar surfaces and be coupled such that their respective surfaces are substantially coplanar with one another.

As mentioned above, cavities may be formed between the light guide and the gasket. In some instances, the gasket may include notches, pockets, recessions, pouches, chambers, apertures, or receptacles such that when the gasket is coupled to the light guide, cavities are formed. Thus, in some examples, the cavities may be interposed between a surface of the gasket, such as the interior surface of the gasket, and a surface of the light guide, such as the exterior surface of the light guide.

The cavities may be sized to receive internal components of the electronic device and may house the internal components and protect the internal components from multiple sides (e.g., four sides). When the internal components reside within the cavities, the internal components may occupy a same layer of the display as the light guide and the gasket. To accommodate various internal components and different configurations thereof, the gasket may take a plurality of shapes and/or profiles. In addition, in some instances, the cavities may extend through an entire thickness of the gasket or may extend partially therethrough.

In some instances, walls or dividers may be interposed between adjacent cavities. In some examples, the walls or dividers may contact the exterior surface of the light guide, while in some examples, the walls or dividers may be spaced from the exterior surface of the light guide. Stated another way, at least a portion of the interior surface of the gasket may occupy a space between adjacent internal components, such as the light sources.

In some instances, the walls or dividers may prevent or minimize light bleeding between adjacent light sources, may assist in directing light towards the light guide, may provide greater bonding surface area between the gasket and the light guide, may provide greater bonding surface area between the gasket and the circuit board, may provide greater bonding surface area between the gasket and adhesive tape, and/or may assist in water-proofing the display. In some instances, the walls or dividers may extend partially or completely through a thickness of the gasket.

The gasket may be made of any resilient, water-proof, material that resists water permeation into the cavities. In some instances, the gasket may be made of a closed cell acrylic foam, a high-density foam, an amorphous polymer, an elastomeric polymer, a polyurethane foam, polymeric foams, plastics, silicones, or other plastic or foam materials. In some examples, the gasket may be made of a material that has a non-porous exterior surface. In some instances, the gasket may be VHB™, made and manufactured by The 3M™ Company of Maplewood, Minn.

A circuit board may be coupled at least a portion of the light guide and at least a portion of the gasket. In some examples, the circuit board may enclose the cavities on a first (e.g., bottom) side. Stated another way, in some instances, when the circuit board is coupled to the light guide and the gasket, the internal components may be placed within the cavities, so as to reside within a same layer of the display as the light guide and the gasket, and one or more openings of a bottom portion of the one or more cavities may be enclosed and sealed by the circuit board. The sealing by the circuit board may prevent water from entering from the first side of the cavities (e.g. the bottom).

In some instances, adhesive may be interposed between the circuit board and the light guide and the gasket. The adhesive may be applied to the circuit board, the light guide, and/or the gasket. In some instances, the adhesive may be an optically clear adhesive. In addition, as the circuit board couples and spans an interface between the light guide and the gasket, the circuit board may help reinforce a bond between the light guide and the gasket.

The circuit board may be made of any suitable waterproof material, such as composites, plastics, metals, or any combination thereof. In some instances, the circuit board may be a flexible printed circuit assembly (FPCA). The FPCA may comprise a composite of polymeric material, silicon, and/or metal, and may be impervious or resistant to water.

As discussed above, internal components may reside within the cavities. In some instances, the internal components may include one or more light sources, such as light emitting diodes (LEDs). The light source(s) may be positioned, configured, or coupled to the circuit board such that when the circuit board is coupled to the light guide and the gasket, the light sources are disposed within the cavities. In some instances, individual light sources may be disposed within a corresponding or respective cavity. Therefore, in some instances, the circuit board may occupy a different layer of the display than the light guide, the gasket, and the internal components. The circuit board, and correspondingly, the light guide and gasket, may be sized and configured to include any number of light sources.

Adhesive tape may couple to least a portion of the light guide and at least a portion of the gasket, at surfaces opposite to where the circuit board couples to the light guide and the gasket. That is, the adhesive tape and the circuit board may enclose or sandwich the light guide and the gasket as well as the internal components, such that the light guide and the gasket are interposed between the adhesive tape, on one side, and the circuit board on another side. In line with the above example, the adhesive tape may enclose a top of the cavity, or occupy a different layer of the display than the light guide, the gasket, the circuit board, and the internal components. In addition, similar to the circuit board, as the adhesive tape couples and spans an interface between the light guide and the gasket, the adhesive tape may help reinforce a bond between the light guide and the gasket.

The light guide, the gasket, the circuit board, and the adhesive tape may enclose the cavities. That is, when the internal components reside within the cavities, the internal components may be enclosed on multiple sides: the light guide on one side (e.g., first lateral side); the gasket on three sides (e.g., second lateral side and first and second longitudinal ends); the circuit board on one side (e.g., bottom); and the adhesive tape on one side (e.g., top).

In some instances, such as when the internal components include light sources, the adhesive tape may be transparent, opaque, or translucent, allowing light emitted by the light sources, for instance, to pass therethrough. In some instances, the adhesive tape may be optically clear, such that the adhesive tape may have a minimal effect on light emitted by the light sources, so as to maintain their brightness, luminosity, performance, and/or appearance. In addition, the adhesive tape may prevent water from reaching the internal components. In some examples, an adhesive layer of the adhesive tape may vary in order to create different bonding characteristics and properties with the light guide and the gasket.

In combination, the light guide, the gasket, the circuit board, and the adhesive tape may be sufficiently bonded or adhered to one another, so as to make the cavities water-proof. That is, the display may have a water-tight enclosure occupied by the light sources through a multi-layer display (i.e., the adhesive tape, the light guide and the gasket, and the circuit board). The water-proofing of the display may, in some instances, prevent a distortion of light emitted by the light sources even when water enters an outer housing of the electronic device. In prior water-resistant electronic devices, if water entered the outer housing of the electronic device it would occupy a space around the light sources, the light guide, or a display area and distort an appearance of the light or a projected image, resulting in a poor or undesirable appearance. In contrast, the water-proof enclosure of the display described in this application may, at the outset, prevent or minimize such distortion or damage to internal components even if water enters the outer housing of the electronic device.

To prevent water, moisture, or other foreign debris from reaching the internal components, various thicknesses of adhesive or various adhesives may be used to couple the circuit board, the light guide, the adhesive tape, or the gasket. For instance, as mentioned above, the circuit board may be adhered to the light guide and the gasket via an adhesive layer, such as an optically clear adhesive. By way of another example, to further couple the light guide and the gasket, adhesive may be deposited on interfacing surfaces or edges (e.g., at one or more interfaces between gasket and the light guide). In some instances, the adhesives may be insoluble in water, or other liquids, so as to not separate or peel away. The adhesives applied in this manner and/or those included on the adhesive tape, for instance, may be selectively applied to prevent the adhesives from bleeding over or overflowing into the cavities and/or onto the light sources. Such controlled application may, in some instances, prevent or reduce light shifts (e.g., blue shift) or overheating of the light sources.

The water-proof enclosure of this application may therefore, in some examples, prevent damage or sub-par performance of the electronic device. For instance, the water-proof enclosure may prevent water from reaching the one or more light sources and potentially short-circuiting the light sources and/or distorting light produced by the one or more light sources.

Moreover, the water-tight enclosure according to this application may water-proof the light sources without sacrificing an aesthetic appearance or overall thickness of the display. That is, as users generally prefer electronic devices to be relatively small and thin, the water-proof enclosure may be capable of providing waterproofing techniques in a compact manner. Particularly, the adhesive tape and the circuit board may be repurposed in the sense that they (1) help water-proof the cavities and (2) carry out their respective functions. That is, the adhesive tape may allow light to pass therethrough, while at the same time water-proofing a first side of the cavities. Similarly, the circuit board may serve as a substrate to which the one or more light sources are mounted and by which the one or more light sources are powered, while water-proofing a second side of the cavities opposite the first side. In contrast, conventional displays may employ additional water-proofing materials or techniques to adequately water-proof the cavities.

The materials making up the display may be strong and resilient so as to protect against punctures or forces applied to the electronic device. Additionally, the light guide, the gasket, the circuit board, and the adhesive tape may be embodied as single pieces of materials, respectively, so as limit seams through which water could leak. However, in some instances, the light guide, the gasket, the circuit board, and the adhesive tape may be manufactured from multiple pieces of materials that are assembled together.

While the examples given herein describe a water-tight enclosure housing light sources of an electronic device, in other examples the techniques discussed herein may be used to provide a water-tight enclosure for one or more other internal components of an electronic device (e.g., processors, batteries, radios, circuitry, sensors (e.g., hall, touch, proximity) etc.). Also, the techniques may be applied to a wide variety of electronic devices. For instance, examples of electronic devices having displays that can employ the techniques described herein may include, by way of example and not limitation, mobile phones (e.g., cell phones, smart phones, etc.), tablet computing devices, electronic book reader devices, laptop or all-in-one computers, media players, portable gaming devices, televisions, monitors, cameras, wearable computing devices, and electronic picture frames. In some examples, the techniques described herein may additionally or alternatively be used with audio virtual assistant devices, radios, speakers, personal computers, external hard drives, input/output devices (e.g., remote controls, game controllers, keyboards, mice, touch pads, microphones, speakers, etc.), or any other electronic device having one or more light sources or other electronic components that can be enclosed in a water-tight cavity bounded by one or more light guides, gaskets, printed circuit assemblies, and/or adhesive tapes.

Additional details of these and other examples are described below with reference to the drawings.

Example Display

FIG. 1 illustrates a perspective exploded view of an example display 100. In some instances, the display 100 may include a display screen 102, a light guide 104 coupled to the display screen 102, a gasket 106, a flexible printed circuit assembly 108, light sources 110 disposed on or communicatively coupled to the flexible printed circuit assembly 108, an optically clear adhesive 112, and adhesive tape 114 (collectively "components"). In the discussion of the figures, various references may be made to a front, back, top, bottom, side, etc. The Cartesian (X-Y-Z) coordinate system included in FIG. 1 is meant to assist in the discussion of the display 100 and will be referenced herein.

As mentioned above, the light guide 104 may include a structure configured to direct light from the light sources 110 towards the display screen 102. The light guide 104 may span a length of the display screen 102, or may be sized smaller than the display screen 102 and/or the display 100. In some instances, the light guide 104 may be coupled to the display screen 102 or may be integrated therewith.

The gasket 106 may couple to an exterior surface 116 of the light guide 104. The gasket 106 may include notches 118 disposed on an interior surface 120 of the gasket 106. A first or "interior" edge of the gasket 106 may be coupled to an edge or "exterior surface" of the light guide 104, forming cavities interposed between the exterior surface 116 of the light guide 104 and the interior surface 120 of the gasket 106. When the light guide 104 and the gasket are coupled together, multiple cavities may be defined by the notches 118 disposed in the interior surface 120 and between ends of the gasket 106. The ends of the gasket 106 may be coupled to the light guide 104. The cavities may be of any size and each may be configured to receive and house one or more internal components. In addition, the gasket 106 may be of a similar or different length than the light guide 104.

To form the water-tight enclosure, in some instances, the ends of the gasket 106 may be adhered, bonded, sealed, or otherwise coupled to the exterior surface 116 of the light guide 104 in a water-tight manner. In some instances, a portion of the interior surface 120 of the gasket 106 may additionally or alternatively be coupled to the exterior surface 116 of the light guide 104. For instance, adhesive may be applied at an interface 204 where the exterior surface 116 of the light guide 104 and the interior surface 120 of the gasket 106 adjoin. When coupled together, for instance, via the adhesive applied at the interface 204, the light guide 104 and the gasket 106 may form a water-tight seal that is impermeable to liquid ingress.

In some instances, a thickness of the gasket 106 may be substantially the same as a thickness of the light guide 104, such that top and bottom surfaces of the gasket are substantially flush with top and bottom surfaces of the light guide, respectively. That is, a top surface of the light guide 104 may be substantially co-planar with a top surface of the gasket 106, and similarly, a bottom surface of the light guide 104 may be substantially co-planar with a bottom surface of the gasket 106. In the illustrated example, the top surfaces of the light guide 104 and the gasket 106 may be on first X-Y plane, and the bottom surfaces of the light guide 104 and the gasket 106 may be in a second X-Y plane that is spaced in the Z direction by a distance equal to the thickness of the light guide 104 and the gasket 106.

The notches 118 are shown as being separated by walls 122, facades, dividers, partitions, or other surfaces that extend at least partially between adjacent light sources 110. When the gasket 106 is coupled to the light guide 104, the walls 122 may be offset or spaced from the exterior surface 116 of the light guide 104, or may contact or couple with the light guide 104. However, the walls 122 may be larger or smaller in the X or Y directions than depicted in FIG. 1. In some instances, one or more of the walls 122 may be adhered, bonded, sealed, or otherwise coupled to the light guide 104. In such examples, the length of the walls 122 (in the Y direction) may be increased, so as to increase the bonding surface and/or a bond between the light guide 104 and the gasket 106.

A bottom surface of the light guide 104 and a bottom surface of the gasket 106 may be adhered, bonded, sealed, or otherwise coupled to the flexible printed circuit assembly 108. In some instances, an optically clear adhesive 112 may be disposed between the flexible printed circuit assembly 108 and the bottom surface of the light guide 104 and the gasket 106. The coupling between the flexible printed circuit assembly 108 and the light guide 104 as well as the coupling between the flexible printed circuit assembly 108 and the gasket 106 may be water-tight. In this sense, the flexible printed circuit assembly 108 may enclose and seal the cavities from liquid ingress. In the illustrative example, the flexible printed circuit assembly 108 may enclose and seal a bottom of the cavities (in the Z-direction). However, in other examples, the flexible printed circuit assembly 108 may enclose and seal a top of the cavities.

In some instances, internal components, such as the light sources 110, may reside within the cavities. The light sources 110 may be coupled to or in contact with the flexible printed circuit assembly 108, so as to electrically connect the light sources 110 with processors, hardware, memory, etc. located elsewhere in an electronic device, via the connection 124. In some instances, the light sources 110 may include LEDs. However, in other examples, other types of light sources may additionally or alternatively be used. When the flexible printed circuit assembly 108 is coupled to the light guide 104 and the gasket 106, the light sources 110 may be disposed within the cavities, in between the walls 122 of adjacent cavities. In some instances, each light source of the light sources 110 may be deposited within a corresponding or respective cavity. Alternatively, or additionally, more than one light source 110, or other internal component (e.g., hall sensor), may be disposed within each cavity.

Adhesive tape 114 may be adhered, bonded, sealed, or otherwise coupled to a top surface of the light guide 104 and a top surface of the gasket 106. That is, the adhesive tape 114 may couple to the light guide 104 and the gasket 106 in the Z-direction and spaced apart from the second X-Y plane where the bottom surface of the light guide 104 and the bottom surface of the gasket 106 are coupled to the flexible printed circuit assembly 108. The coupling between the adhesive tape 114 and the light guide 104 as well as the coupling between the adhesive tape 114 and the gasket 106 may be water-tight. In this sense, the adhesive tape 114 may enclose and seal the cavities. In the illustrated example as previously mentioned, the adhesive tape 114 may enclose and seal a top of the cavities, opposite to where the flexible printed circuit assembly 108 encloses and seals the bottom of the cavities (spaced apart in the Z-direction). However, in some instances, the disposition of the adhesive tape 114 may enclose and seal the bottom of the cavities.

In some instances, similar to the flexible printed circuit assembly 108, the adhesive tape 114 may help bond and retain the light guide 104 and the gasket 106 together.

In addition, the adhesive tape 114 may be transparent, translucent, or opaque, so as to allow light emitted by the light sources 110 to pass through the adhesive tape 114. In some instances, the light emitted by the light sources 110 may be unaffected or substantially unaffected by the adhesive tape 114.

Collectively, when the components are assembled, the light sources 110 within the cavities may be encapsulated on all six sides. For instance: along the first X-Y plane, a bottom of the cavities may be encapsulated by the flexible printed circuit assembly 108, via the optically clear adhesive 112; along the second X-Y plane, a top of the cavities may be encapsulated by the adhesive tape 114; along a first Y-Z plane, the cavities may be encapsulated by the light guide 104; along a second Y-Z plane, the cavities may be encapsulated by the gasket 106; and along a first and second X-Z planes, the cavities may be encapsulated by the gasket 106. Therefore, in instances where the internal components include the light sources 110, the light sources 110 residing with the cavities may be encapsulated in a water-tight enclosure. That is to say, the components may combine to form a sealed, water-tight enclosure, protecting the light sources 110 form damage or malfunction. However, while the display 100 has been illustrated and discussed regarding a particular order or orientation of the light guide 104, the gasket 106, the flexible printed circuit assembly 108, and/or the adhesive tape 114 in respective X-Y-Z planes, in some instances, other combinations may be included. For instance, the adhesive tape 114 may seal the bottom of the cavities while the flexible printed circuit assembly 108 seals a top of the cavities.

The display 100 may be interposed between a top cover 126 and a bottom cover 128. The top cover 126 and/or the bottom cover 128 may serve to encapsulate the display 100 and may provide further water-proofing to the display 100. The top cover 126 and/or the bottom cover 128 may include any materials that provide rigidity to the display 100, protect the display 100, or may include apertures so as to make the display screen 102 visible external to the top cover 126 and/or the bottom cover 128. Furthermore, other layers or components may be interposed between the top cover 126 and the bottom cover 128, as indicated by the series of dots on FIG. 1. For instance, and without limitation, other layers may include a touch-sensitive layer or printed circuit boards (PCBs).

In some instances, as alluded to previously, to further seal and/or water-proof the cavities, glue or adhesive may be deposited, for instance, between seams or interfaces of the light guide 104 and the gasket 106. This application of the adhesive may help enclose and prevent water permeation into the cavities. Furthermore, while FIG. 1 illustrates that the notches 118 are integrated into the gasket 106, in some instances, the notches 118 may be integrated into the light guide 104.

Figure 2:
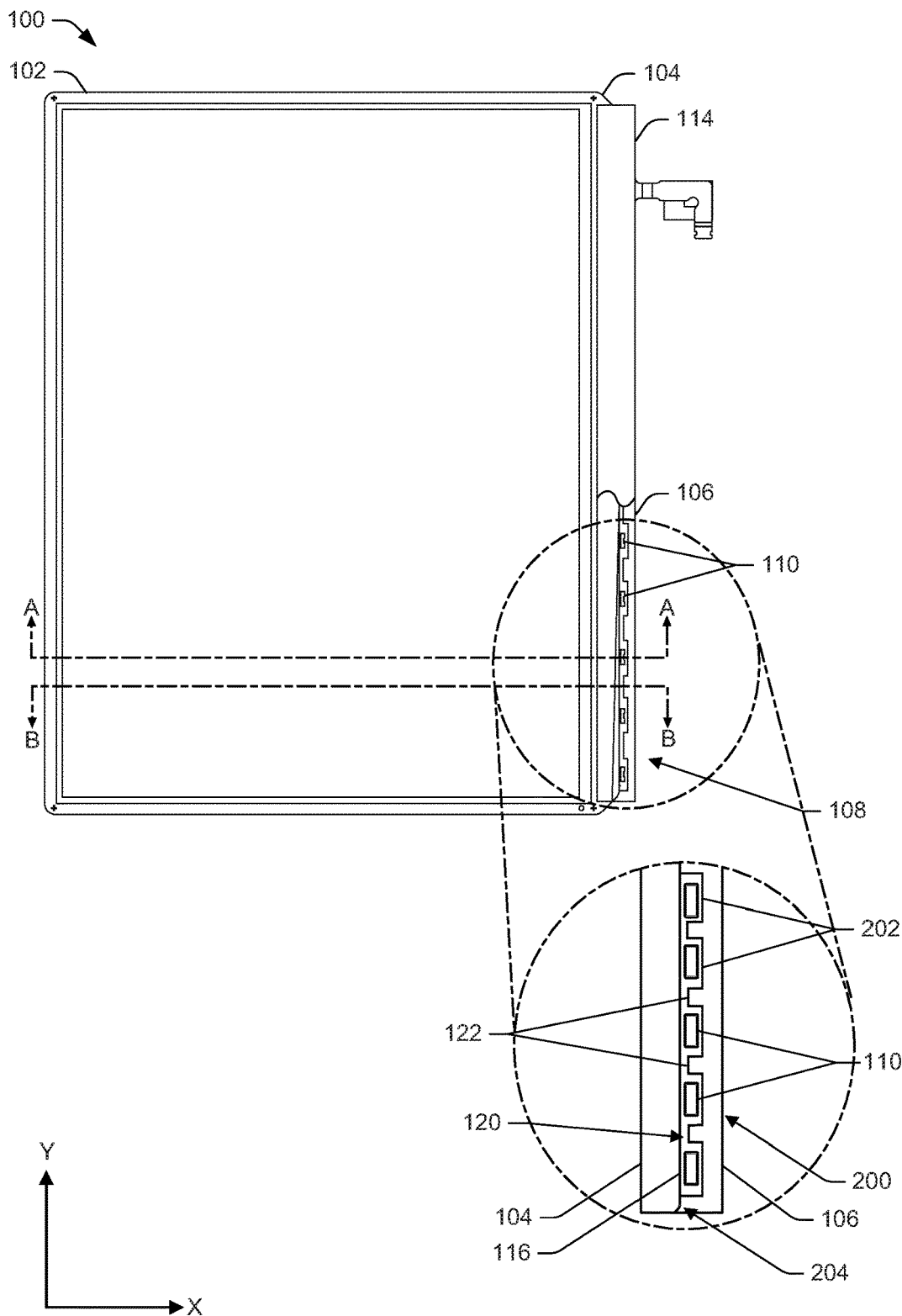
FIG. 2 is a front view of the example display of FIG. 1, with a portion of an adhesive tape cut away to illustrate internal components of the example display.

FIG. 2 illustrates a front view of the display 100, looking from the Z-direction perpendicular to the X and Y planes. In FIG. 2, a portion of the adhesive tape 114 is shown as being cut away to illustrate components of the example display. In addition, FIG. 2 includes an expanded and simplified representation of the display 100.

The display 100 may include the display screen 102. On a side, surface, or edge of the display screen 102, the light guide 104 may be coupled. While FIG. 2 shows the light guide 104 coupled to a particular side or surface of the display screen 102 (along a Y-Z plane), in some instances, the light guide 104 may be included on different sides or on multiple sides of the display screen 102 (e.g., along a X-Z plane). As mentioned previously, the light guide 104 may redirect or disperse light emitted by the light sources 110 towards the display screen 102 and/or other areas of the display 100.

Attached to the light guide 104 may be the gasket 106. The gasket 106 may include the interior surface 120 that is adjacent the light guide 104 and an exterior surface 200 that is distal from the interior surface 120. In this sense, the exterior surface 200 of the gasket 106 may represent an external perimeter of the gasket 106. In some instances, the exterior surface 200 of the gasket 106 may be continuous. A portion of the interior surface 120 of the gasket 106, such as first and second ends, may couple to the light guide 104. In some instances, the first and second ends of the light guide 104 may couple to the exterior surface 116 of the light guide 104, forming a water-tight seal. To further bond the light guide 104 and the gasket 106, an adhesive may be added to a seam or interface disposed between the interior surface 120 of the gasket 106 that couples to the exterior surface 116 of light guide 104.

With reference to FIG. 1, when the gasket 106 is coupled to the light guide 106, cavities 202 may be formed (via the notches 118). Accordingly, the cavities 202 may be interposed between the interior surface 120 of the gasket 106 and the exterior surface 116 of the light guide 104. As shown, when the cavities 202 are formed, the cavities 202 may house the light sources 110. In some instances, the light sources 110 may be communicatively coupled or connected to the flexible printed circuit assembly 108. The cavities 202 may extend down a lengthwise direction the gasket 106, between the first and second ends of the gasket 106.

In addition, the walls 122 may be interposed between adjacent cavities 202. That is, at least a portion of the interior surface 120 of the gasket 106 may protrude or occupy a space between adjacent light sources 110. In some instances, the walls 122 may offset or spaced off the exterior surface 116 of the light guide 104 (as shown). However, in some instances, the walls may couple to the exterior surface 116 of the light guide 104.

While FIG. 2 shows that the cavities 202 have a substantially rectangular shape, in some instances, the cavities 202 may take other shapes (e.g., circular, square, hexagonal, irregular, etc.).

In addition, FIG. 2 also illustrates that the exterior surface 116 of the light guide 104 may be planar along a Y-Z plane and that the gasket 106 may couple to the exterior surface 116. However, in some instances, the light guide 104 may include a lip, rim, or other border that bounds portions of the interior surface 120 or the exterior surface 200 of the gasket 106. In addition, the lip may encapsulate the top surface of the gasket 106 (along a second X-Y plane), the bottom surface of the gasket 106 (along the X-Y plane spaced apart from the second X-Y plane in the Z-direction), and/or the first and second ends of the gasket 106. That is, the gasket 106 may be disposed adjacent to the lip, so that the gasket 102 abuts the lip. In some instances, the lip may further couple the light guide 104 and the gasket 106. In some instance, an adhesive may be disposed between the gasket and the lip. In some instances, the lip may also form an increased water-tight seal between the light guide 104 and the gasket 106.

The adhesive tape 114 may be sized to cover and seal the cavities 202 along a X-Y plane and protect the light sources 110 from water ingress. In FIG. 2, the adhesive tape 114 is shown as completely covering the gasket 106 and only a portion of the light guide 104 and/or other portions of the display 100. However, in some instances, the adhesive tape 114 may cover only a portion of the gasket 106 and/or more or less of the light guide 104 than as illustrated in FIG. 2, so as to extend at other lengths or in other directions onto the light guide 104 and/or the display 100.

In addition, in some instances, to protect the light sources 110 or to couple the light source 110 to the gasket 106, the light guide 104, and/or the adhesive tape 114, additional adhesive may be disposed within or adjacent to the cavities 202. However, in such instances, the adhesive may be added without adversely affecting light emitted by the light sources 110.

Figure 3:
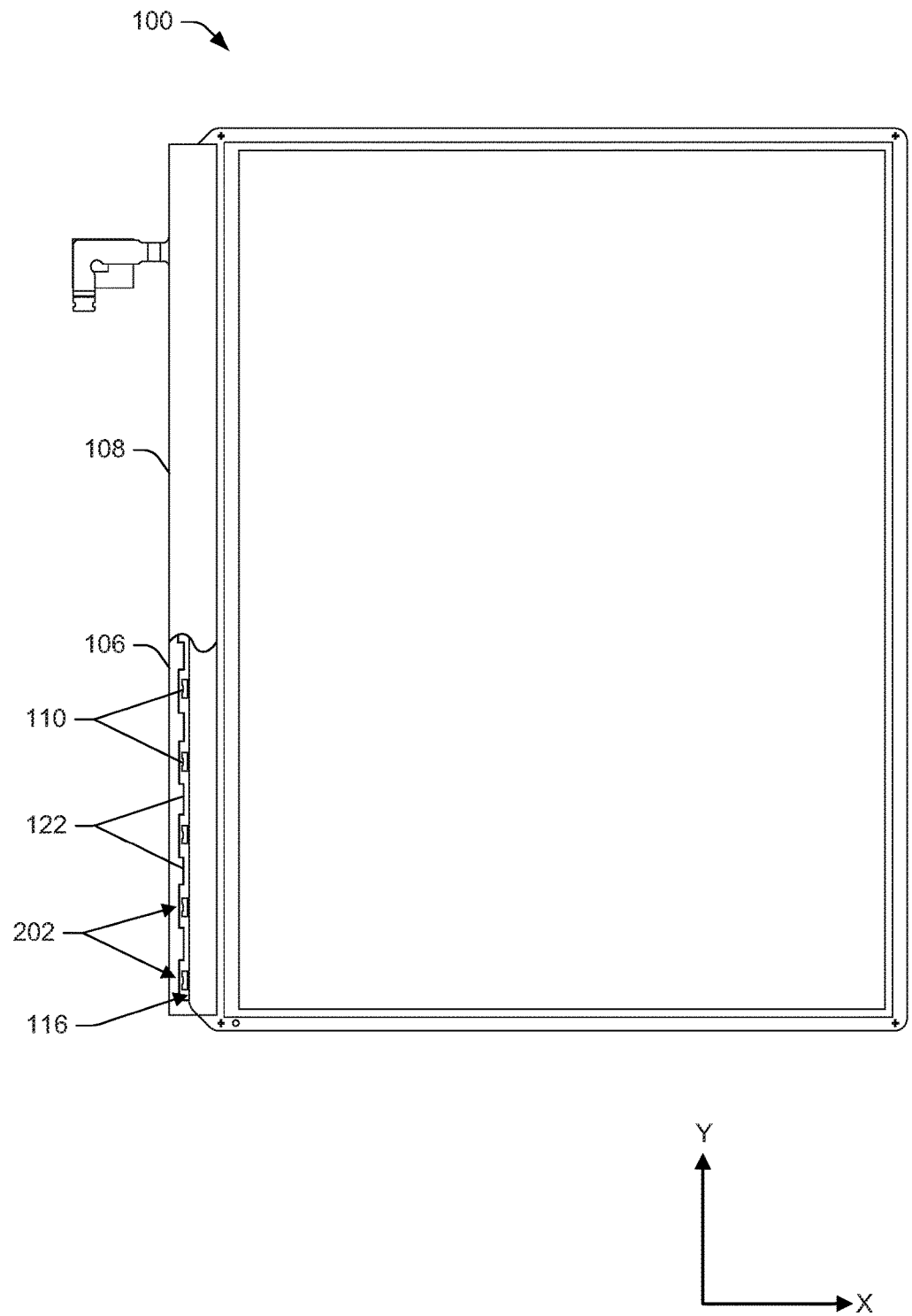
FIG. 3 is a back view of the example display of FIG. 1, with a portion of a flexible printed circuit assembly cut away to illustrate components of the example display.

FIG. 3 is a back view of the display 100, looking from the Z-direction perpendicular to the X-Y plane. Shown in FIG. 3, a portion of the flexible printed circuit assembly 108 is cut away to illustrate components of the example display 100.

The flexible printed circuit assembly 108 may couple to the light guide 104 and the gasket 106, providing the cavities 202 with a water-tight enclosure. The light sources 110 disposed within the cavities 202 are coupled to the flexible printed circuit assembly 108.

The walls 122 may be disposed between adjacent cavities 202. In some instances, as mentioned above, the walls 122 may be offset or spaced apart from the exterior surface 116 of the light guide 104 (in the X-direction) and/or may couple to the exterior surface 116 of the light guide 104, for instance, by applying an adhesive. In addition, while the walls 122 are shown as having a certain thickness in the Y-direction, the walls 122 may be thinner or thicker than that illustrated in FIG. 3.

Moreover, although FIG. 3 shows the flexible printed circuit assembly 108 extending onto the light guide 104 and/or the display 100 to a certain distance, in some instances, the flexible printed circuit assembly 108 may extend at other lengths or in other directions.

Figure 4A:
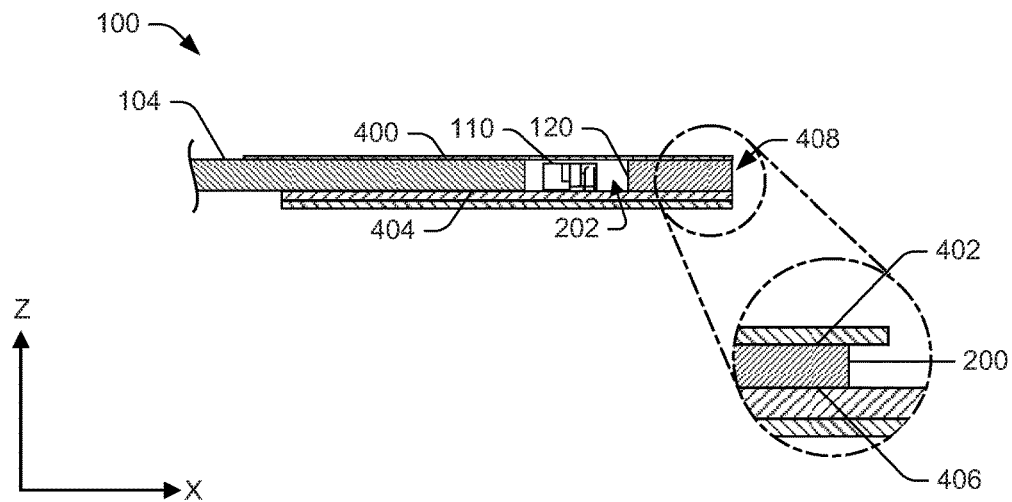
FIG. 4A is a first cross-sectional view of the example display of FIG. 1, taken along line A-A of FIG. 2.
Figure 4B:
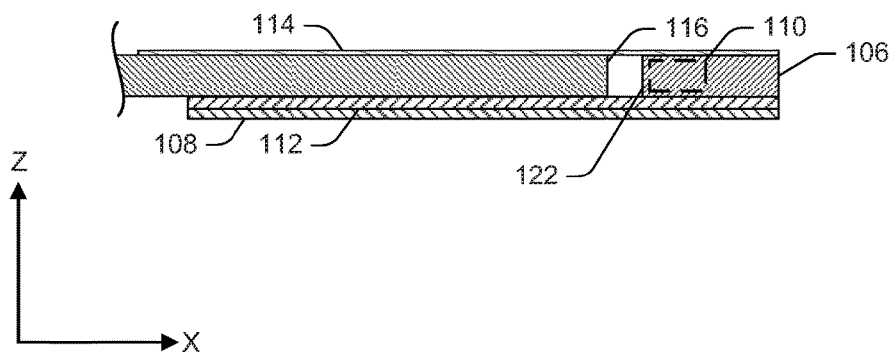
FIG. 4B is a second cross-sectional view of the example display of FIG. 1, taken along line B-B of FIG. 2.

FIGS. 4A and 4B are cross-sectional views of the display 100 taken along lines A-A and B-B of FIG. 2, respectively, looking in the Y-direction perpendicular to the X-Z plane. Particularly, FIG. 4A is a cross-sectional view taken through the light source 110 positioned within the display 100. FIG.

4B is a cross-sectional view taken through the center of the wall 122 of a corresponding cavity of the cavities 202. As shown in FIG. 4B, the light source 110 is represented with dashed lines in order to illustrate its position within the cavities 202.

The gasket 106 may include the interior surface 120 that is adjacent to the light guide 104 and the exterior surface 200 that is distal to the interior surface 120. To encapsulate a top of the cavities 202, the adhesive tape 114 may be adhered to a top surface 400 of the light guide 104 and a top surface 402 of the gasket 106 (in an X-Y plane). As mentioned previously, the top surface 400 of the light guide 104 may be substantially planar with the top surface 402 of the gasket 106. However, in some instances, the top surface 400 of the light guide 104 may not be substantially planar with the top surface 402 of the gasket 106. In addition, in some instances, the top surface 402 of the gasket 106 may be more porous than the exterior surface 200 of the gasket 106, so as to absorb adhesive of the adhesive tape 114.

The walls 122 may be disposed between adjacent cavities 202 and may be offset from the exterior surface 116 of the light guide 104. Shown in FIG. 4B, the light source 110, represented as having dashed lines, may be interposed between the walls 122 of the gasket 106.

The flexible printed circuit assembly 108 may couple to a bottom surface 404 of the light guide 104 and a bottom surface 406 of the gasket 106 (along an X-Y plane that is spaced apart from the top of the cavities 202 in the Z-direction). In addition, in some instances, the bottom surface 404 of the light guide 104 and the bottom surface 406 of the gasket 106 may be substantially planar. In this sense, the light guide 104 and the gasket 106 may occupy a same layer of the display 100, or stated another way, may be of the same or similar thickness. In some instances, the planarness of the surfaces may increase coupling between the light guide 104, the gasket 106, and the flexible printed circuit assembly 108. To further water-proof the display 100, adhesive may be disposed between interfaces or seams of the display 100, such as between the exterior surface 116 of the light guide 104 and the interior surface 120 of the gasket 106. In some instances, the flexible printed circuit assembly 108 may be coupled to the light guide 104 and the gasket 106 by optically clear adhesive 112.

As shown in FIG. 4A, the cavities 202 may extend completely through the gasket 106 (i.e., through a whole thickness of the gasket 106 in the Z-direction). However, in some instances, the cavities 202 may extend through less than all of the thickness of the gasket 106.

The light sources 110 may be disposed within the cavities 202 and may be coupled to the flexible printed circuit assembly 108. To accomplish this, in instances where the optically clear adhesive 112 is used, the light sources 110 may connect with the flexible printed circuit assembly 108 by extending through the optically clear adhesive 112 or the optically clear adhesive 112 may be applied around or spaced from the light sources 110 connected to the flexible printed circuit assembly 108.

In addition, while FIGS. 4A and 4B illustrate that an exterior edge 408 of the display 100 is planar, in some instances, the adhesive tape 114 may overhang or extend beyond the gasket 106, as shown by the expanded view in FIG. 4A. Similarly, the flexible printed circuit assembly 108 may overhang the gasket 106 in a similar manner. In these instances, to seal the flexible printed circuit assembly 108 with the gasket 106 as well as the adhesive tape 114 to the gasket 106, an adhesive may be applied to an area between the respective overhangs.

Figure 5A:
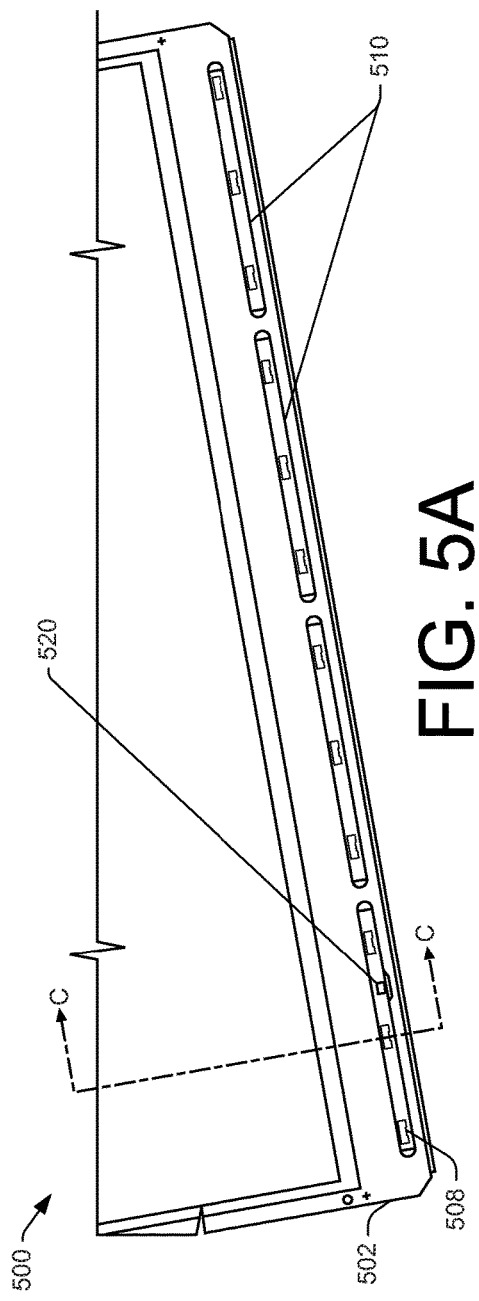
FIG. 5A is a top view of another example display.
Figure 5B:
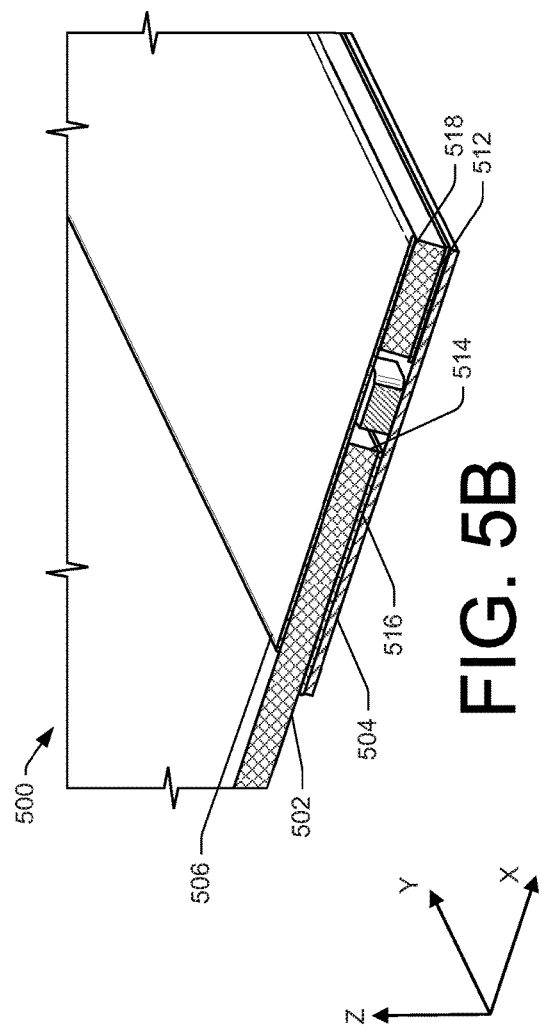
FIG. 5B is a cross-sectional view of the example display of FIG. 5A, taken along line C-C of FIG. 5A.

FIGS. 5A and 5B illustrate an alternative example of a display 500. FIG. 5A is a partial perspective view of the display 500. In addition, FIG. 5B represents a cross-sectional view of the display, taken along line C-C of FIG. 5A.

Similar to the display 100, as discussed above, the display 500 may include a light guide 502, a flexible printed circuit assembly 504, adhesive tape 506, and light sources 508. However, as shown, in some instances, the display 500 in this example may omit a gasket enclosing the light sources 508.

Instead, in this example, the light sources 508 may be disposed in channels 510 punched, pressed, cut or otherwise formed in the light guide 502, between a bottom surface 512 and a top surface 518. That is, the channels 510 may extend between a first X-Y plane, representing a bottom surface 512 of the light guide 502, and a second X-Y plane, representing a top surface 518 of the light guide. The channels 510 may be separated from one another so as to not be coupled along a length of the light guide 502 (in the X-direction). In such instances, portions of the light guide 502 may be interposed between adjacent channels 510. To limit liquid penetration and voids, the light guide 502 may be made from a single piece water-impermeable of material such as glass or plastic.

The light sources 508 may be communicatively coupled to the flexible printed circuit assembly 504. To encapsulate the channels 510 from the bottom (first X-Y plane), for instance, the flexible printed circuit assembly 504 may couple to the bottom surface 512 of the light guide 502. Accordingly, when the flexible printed circuit assembly 504 is coupled to the light guide 502, the light sources 508 may be disposed within the channels 510, so as to be interposed within an interior surface 514 of the channels 510. In some instances, an optically clear adhesive 516 may couple to the flexible printed circuit assembly 504 and the light guide 502, forming a water-tight seal. In addition, a distance between the light sources 508, for instance, and the interior surface 504 of the channels 510 may be more or less than that shown in FIGS. 5A and 5B. The channels 510 may also be sized to receive multiple or any number of the light sources 508. In some examples, each channel may house a single light source. In some examples, each channel may house multiple light sources. In some examples, a single channel may be used which houses all of the light sources.

On the top surface 518 of the light guide 502, the adhesive tape 506 may be applied over the channels 510 (along the second X-Y plane). In some instances, to couple the adhesive tape 506 to the light guide 502, the adhesive tape 506 may have or include an optically clear adhesive. The adhesive tape 516 may seal a top of the channels 510, preventing water or other liquids from reaching the light sources 508. As discussed above with regards to the display 100, the adhesive tape 506 may permit light from the light sources 508 to pass therethrough without being substantially affected.

Collectively, the light guide 502, the flexible printed circuit assembly 504, and the adhesive tape 506 may form a water-tight enclosure occupied by the light sources 508. That is, in this example, the light sources 508 may be encapsulated on four sides (lateral and longitudinal) by the light guide 502, on a bottom by the flexible printed circuit assembly 504 (first X-Y plane), and a top by the adhesive tape 506 (second X-Y plane). In some instances, the display 100 may include multiple layers, including the flexible printed circuit assembly 504, the light guide 502 with the light sources 508, and the adhesive tape 506. Similar to the display 100, other internal components may reside within the water-tight enclosure in addition to or instead of the light sources 508.

Additionally, or alternatively, and as mentioned above, internal components other than the light sources 508 may be included within the channels 510. For instance, a hall sensor 520 may be disposed within the channels 510. That is, the channels 510 may be occupied more different or like internal components, such as the hall sensor 520 and the light sources 508. In some instances, the channels 510 may be correspondingly notched or grooved to receive the additional internal components (e.g. the hall sensor 510, which illustrates a notch residing into the interior surface 514 of one of the channels 510).

Example Process of Forming a Water-Tight Enclosure

Figure 6:
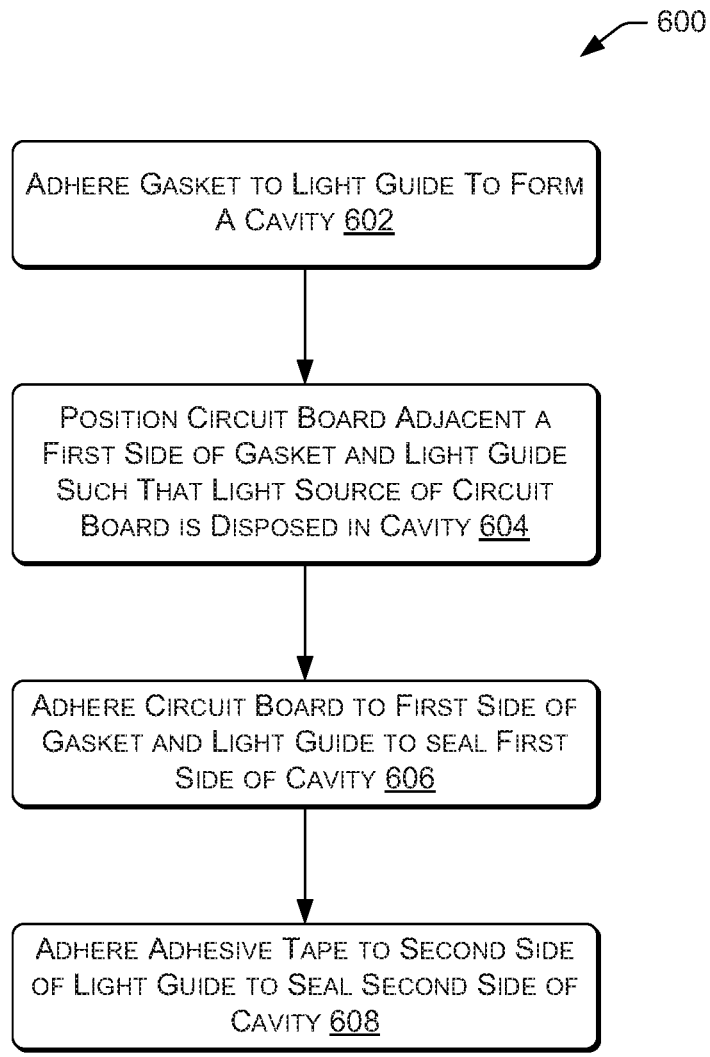
FIG. 6 is an example process to form a water-tight enclosure for a display of an electronic device.

FIG. 6 illustrates an example process 600 of forming a water-tight enclosure(s). The order in which the operations are described is not intended to be construed as a limitation, and any number of the described operations can be combined in any order and/or in parallel to implement the process.

At operation 602, a gasket may be secured or adhered to a light guide, which in some instances, may be coupled to a display. The gasket and the light guide may be coupled together using adhesive, sonic or thermal welding, or other attachment means. In addition, top surfaces and bottom surfaces of the gasket and light guide, respectively, may be aligned, so as to be co-planar. When coupled, cavities may be interposed between the gasket and the light guide. Adhesive used to adhere the gasket and/or the light guide may be selectively applied, so as to limit runoff or bleeding over into the cavities. When coupled, the gasket and the light guide may form a water-tight seal.

At operation 604, light sources deposited on the flexible printed circuit assembly, or communicatively coupled thereto, may be aligned within the cavities interposed between the light guide and the gasket. In some instances, the flexible printed circuit assembly may be aligned with a first side or a bottom surface of the cavities, with the light sources protruding from the flexible printed circuit assembly into the cavities.

At operation 606, the flexible printed circuit assembly may be coupled to bottom surfaces of the gasket and the light guide, respectively. In some instances, the flexible printed circuit assembly, the light guide, and the gasket may be coupled together using an optically clear adhesive. Accordingly, in such instances, the optically clear adhesive may be aligned or deposited on the flexible printed circuit assembly, the light guide, and/or the gasket. Thus, when the flexible printed circuit assembly is coupled to the gasket and the light guide, the light sources may reside within or occupy the cavities and may be sealed from the bottom. The adhesion between the flexible printed circuit assembly and the gasket and the light guide may form a water-tight seal. At operation 606, prior to coupling the flexible printed circuit board to the light guide and the gasket, in some instances, ends, surfaces, and/or edges of the flexible printed circuit assembly may be aligned with ends, surfaces, or edges of the gasket and/or light guide, respectively. However, in some instances, the flexible printed circuit assembly may overhang an exterior surface of the gasket.

At operation 608, adhesive tape may be adhered to top surfaces of the gasket and the light guide, respectively, so as to enclose a top or second side of the cavities. In some instances, the adhesive tape may be transparent or translucent, allowing light from the light sources to pass therethrough. The adhesive tape may couple to all or a portion of the gasket and the light guide, or other components of an electronic device. In addition, ends, surfaces, or edges of the adhesive tape may be aligned with the ends, surfaces, or edges of the gasket and/or the light guide. However, in some instances, the adhesive tape may overhang the gasket. In that case, adhesive may be applied between the overhang of the adhesive tape and the overhang of the flexible printed circuit assembly. Additionally or alternatively, the overhang of the adhesive tape may be pressed down into contact with the exterior of the gasket and/or the opposing overhang of the flexible printed circuit assembly to provide a further barrier against moisture.

The process 600 is not limited to the explicit operations recited and may include other operations. For instance, adhesive may be applied to seams or interfaces of the display, such as an interface between the light guide and the gasket. In addition, the water-tight enclosure of this application may be manufactured using a variety of manufacturing techniques.

The process 600 described herein may be employed to efficiently fabricate a water-tight enclosure for different arrangements of internal components. In addition, the operations discussed in the process 600 may be performed in other orders. For instance, the flexible printed circuit assembly may and the light guide may first be adhered together. Thereafter, the gasket may be adhered to both the light guide and the flexible printed circuit assembly, such that the light sources are disposed with the cavities.

CONCLUSION

While various examples and embodiments are described individually herein, the examples and embodiments may be combined, rearranged and modified to arrive at other variations within the scope of this disclosure. In addition, although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. An electronic device, comprising:
a housing; and
a display disposed at least partially within the housing, the display including:
a light guide having a top surface and a bottom surface;
a gasket coupled to at least a portion of the light guide, the gasket having a top surface and a bottom surface, and wherein a cavity is interposed between an interior surface of the gasket and the light guide;
a flexible printed circuit assembly coupled to the bottom surface of the light guide and the bottom surface of the gasket, the flexible printed circuit assembly sealing a bottom of the cavity;
a plurality of light sources connected to the flexible printed circuit assembly, wherein the plurality of light sources are disposed within the cavity; and
adhesive tape coupled to the top surface of the light guide and the top surface of the gasket, the adhesive tape sealing a top of the cavity.

2. The electronic device of claim 1, wherein:
the light guide bounds a first side of the cavity;
the gasket bounds a second side, a third side, and a forth side of the cavity;

the flexible printed circuit assembly bounds a fifth side of the cavity;

the adhesive tape bounds a sixth side of the cavity; and collectively the light guide, the gasket, the flexible printed circuit assembly, and the adhesive tape seal the cavity from water.

3. The electronic device of claim 1, wherein at least a portion of the interior surface of the gasket protrudes into a space between first and second adjacent light sources of the plurality of light sources.

4. The electronic device of claim 1, wherein the gasket includes at least one of a plastic or a foam material.

5. A display stack, comprising:

a first layer including a flexible printed circuit assembly;

a second layer positioned adjacent the first layer, the second layer including:
  a light guide;
  a gasket having an interior surface and an exterior surface, wherein at least a portion of the gasket is coupled to a side of the light guide;
  a cavity interposed between the interior surface of the gasket and the light guide; and
  a plurality of light sources coupled to the flexible printed circuit assembly, wherein the plurality of light sources are disposed within the cavity; and a third layer positioned adjacent the second layer, the third layer including adhesive tape coupled to the light guide and the gasket to enclose the cavity.

6. The display stack of claim 5, wherein the first layer and the third layer are sealed to the second layer to prevent water from reaching the plurality of light sources in the cavity.

7. The display stack of claim 5, wherein the cavity includes multiple separate cavities interposed between the interior surface of the gasket and the light guide, and wherein individual light sources of the plurality of light sources are disposed within individual cavities of the multiple separate cavities.

8. The display stack of claim 5, wherein:

the gasket comprises multiple protrusions protruding from the interior surface of the gasket toward the side of the light guide, and individual protrusions of the multiple protrusions protrude into the cavity between adjacent light sources of the plurality of light sources.

9. The display stack of claim 5, wherein the gasket is continuous and extends along a length of the light guide.

10. The display stack of claim 5, wherein the gasket includes at least one of a plastic or a foam material.

11. The display stack of claim 5, wherein the plurality of light sources are spaced substantially equidistantly along a length of the light guide.

12. The display stack of claim 5, wherein the plurality of light sources are coupled to the flexible printed circuit assembly in a line that is substantially parallel to the side of the light guide.

13. A device, comprising:

a housing; and a display disposed within the housing, the display including:
  a light guide;
  a gasket coupled to a side of the light guide;
  a cavity interposed between the light guide and the gasket;
  a circuit board coupled to at least a portion of the light guide and at least a portion of the gasket, the circuit board inhibiting liquid from reaching the cavity;
  a plurality of light sources connected to the circuit board, wherein the plurality of light sources are disposed within the cavity; and
  adhesive tape coupled to at least a portion of the light guide and at least a portion of the gasket, the adhesive tape inhibiting liquid from reaching the cavity.

14. The device of claim 13, wherein the gasket is coupled to light guide using an adhesive.

15. The device of claim 13, wherein the gasket includes:

an exterior surface; and an interior surface, and wherein the light guide bounds a first side of the cavity and the interior surface of the gasket bounds second, third, and fourth sides of the cavity, the circuit board bounds a fifth side of the cavity, and the adhesive tape bounds a sixth side of the cavity, such that collectively the light guide, the gasket, the circuit board, and the adhesive tape seal the cavity from water.

16. The device of claim 13, wherein:

the plurality of light sources are spaced substantially equidistantly along a length of the light guide, and the gasket includes a plurality of protrusions that protrude from the gasket toward the light guide, such that individual protrusions of the plurality of protrusions protrude into spaces between adjacent light sources of the plurality of light sources.

17. The device of claim 16, wherein the plurality of light sources are coupled to the circuit board in a line that is substantially parallel to the side of the light guide.

18. The device of claim 13, wherein the gasket includes:

a first end coupled to the light guide; and a second end coupled to the light guide, wherein at least a portion of the gasket between the first end and the second end is spaced from the light guide.

19. The device of claim 13, wherein the gasket includes at least one of a plastic or a foam material.

20. The device of claim 13, wherein the circuit board comprises a flexible printed circuit assembly.

* * * * *